(12) United States Patent
Yamawaku et al.

(10) Patent No.: US 9,385,015 B2
(45) Date of Patent: Jul. 5, 2016

(54) TRANSFER CHAMBER AND METHOD FOR PREVENTING ADHESION OF PARTICLE

(75) Inventors: Jun Yamawaku, Nirasaki (JP); Junji Oikawa, Nirasaki (JP); Hiroyuki Nakayama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1144 days.

(21) Appl. No.: 12/700,771

(22) Filed: Feb. 5, 2010

(65) Prior Publication Data

US 2010/0202093 A1   Aug. 12, 2010

Related U.S. Application Data

(60) Provisional application No. 61/228,675, filed on Jul. 27, 2009.

(30) Foreign Application Priority Data

Feb. 9, 2009  (JP) .................................. 2009-027369

(51) Int. Cl.
*H01L 21/677* (2006.01)
*H01L 21/67* (2006.01)

(52) U.S. Cl.
CPC .... *H01L 21/67201* (2013.01); *H01L 21/67196* (2013.01)

(58) Field of Classification Search
USPC ........................................ 156/345.31–345.32
See application file for complete search history.

(56) References Cited

U.S. PATENT DOCUMENTS

| | | | | |
|---|---|---|---|---|
| 6,178,660 B1* | 1/2001 | Emmi et al. | ..................... | 34/412 |
| 7,306,680 B2* | 12/2007 | Heerens | .......................... | 134/21 |
| 7,306,880 B2* | 12/2007 | Noh | .............................. | 429/332 |
| 2005/0087136 A1* | 4/2005 | Moriya et al. | ................ | 118/719 |
| 2005/0268408 A1* | 12/2005 | Chin | ............................ | 15/1.51 |
| 2006/0090703 A1* | 5/2006 | Kaise et al. | .................. | 118/719 |
| 2007/0157402 A1* | 7/2007 | Caffarella | ..................... | 15/1.51 |

FOREIGN PATENT DOCUMENTS

| | | |
|---|---|---|
| EP | 790642 A2 * | 8/1997 |
| JP | 2000-325774 A | 11/2000 |
| JP | 2002-353086 | 12/2002 |

\* cited by examiner

*Primary Examiner* — Karla Moore
(74) *Attorney, Agent, or Firm* — Rothwell, Figg, Ernst & Manbeck, P.C.

(57) ABSTRACT

A transfer chamber is provided between a processing unit for performing a predetermined process on a target substrate to be processed in a depressurized environment and an atmospheric maintaining unit for maintaining the target substrate in an atmospheric environment to transfer the target substrate therebetween. The transfer chamber includes a chamber main body for accommodating the target substrate, a gas exhaust unit for exhausting the chamber main body to set the chamber main body to the depressurized environment, and a gas supply unit for supplying a predetermined gas to the chamber main body to set the chamber main body in the atmospheric environment. Further, in the transfer chamber, an ionization unit is provided outside the chamber main body, for ionizing the predetermined gas and an ionized gas supply unit is provided to supply the ionized gas generated by the ionization unit to the chamber main body.

4 Claims, 5 Drawing Sheets

TRANSFER CHAMBER AND METHOD FOR PREVENTING ADHESION OF PARTICLE

CROSS-REFERENCE TO RELATED APPLICATIONS

This application claims priority to Japanese Patent Application No. 2009-027369 filed on Feb. 9, 2009, the entire contents of which are incorporated herein by reference.

FIELD OF THE INVENTION

The present invention relates to a transfer chamber for transferring a target substrate to be processed between a processing unit for processing the target substrate in a depressurized environment and an atmospheric maintaining unit for maintaining the target substrate in an atmospheric environment, and a method for preventing adhesion of particles to the target substrate in the transfer chamber.

BACKGROUND OF THE INVENTION

For example, in a plasma etching apparatus for performing dry etching on a semiconductor wafer, an inner space of a processing chamber where the semiconductor is actually etched is constantly maintained in a vacuum environment. Meanwhile, the semiconductor wafer to be etched is loaded into the plasma etching apparatus while being accommodated in a FOUP (Front Opening Unified Pod) in an atmospheric atmosphere, for example.

The plasma etching apparatus includes a mounting unit for mounting thereon a FOUP in an atmospheric atmosphere, and a transfer chamber whose environment can be switched between a vacuum state and an atmospheric state is provided between the mounting unit and the processing chamber in order to load and unload the semiconductor wafer between the FOUP and the processing chamber (e.g., Japanese Patent Application Publication No. 2002-353086 (Patent Document 1)).

A first and a second gate valve are provided between the mounting unit and the transfer chamber and between the transfer chamber and the processing chamber, respectively. When the atmosphere of the inner space of the transfer chamber is in the atmospheric environment, the first gate valve is opened while closing the second valve. In that state, the semiconductor wafer is loaded from the FOUP into the transfer chamber and, then, the first gate valve is closed. Next, the transfer chamber is depressurized to a pressure substantially equal to that in the processing chamber. Thereafter, the second gate valve is opened while closing the first gate valve. In that state, the semiconductor wafer is loaded from the transfer chamber into the processing chamber. Then, the second gate valve is closed, and an etching process is performed in the processing chamber. Next, the semiconductor wafer is transferred from the processing chamber to the FOUP in a reverse sequence of the above-described operation.

In the above series of the processing, the adhesion of particles to the semiconductor wafer in the transfer chamber becomes a problem as a pattern of semiconductor devices formed on the semiconductor wafer becomes more miniaturized. Therefore, in the aforementioned Patent Document 1, a charge neutralizer for generating an ion stream is provided in the transfer chamber in order to remove particles adhered to an inner wall of the transfer chamber (referred to as an "air lock chamber" in the Patent Document 1).

Here, the charge neutralizer emits the ion stream to the transfer chamber and neutralizes the charge of the particles adhered by electrostatic force (Coulomb force) to the inner wall of the transfer chamber by using ions in the ion stream (elimination of static electricity) so that the particles can be separated from the inner wall. Next, the particles are removed from the transfer chamber by discharging gas in the transfer chamber to the outside by a suction unit.

Moreover, in the Patent Document 1, after the particles adhered to the inner wall of the transfer chamber are discharged and removed, the semiconductor wafer is loaded into the transfer chamber. Then, the electrically charged particles adhered to the semiconductor wafer are attracted onto the electrode by applying a voltage, while considering an electrically charged state of the semiconductor wafer, to an electrode disposed above the semiconductor wafer.

Although a specific method for generating ions by the charge neutralizer provided in the transfer chamber is not described in the Patent Document 1, it may be considered that a corona discharge is used as an excellent method to generate positive ions and negative ions while maintaining an ion balance. In addition, UV irradiation or X-ray irradiation may be used as a method to generate ions.

However, in the ion generation method using the corona discharge, particles may be also generated by the corona discharge and the particles thus generated may remain in the transfer chamber to be adhered to the semiconductor wafer loaded into the transfer chamber.

Moreover, in the Patent Document 1, an additional electrode for electrostatically attracting particles is provided above the semiconductor wafer in order to remove the particles adhered to the semiconductor wafer. In that case, a power supply for applying a high voltage to the electrode is required and, therefore, the configuration and the control of the apparatus become complicated.

As can be clearly seen from the above-described configuration, the charge of the semiconductor wafer is not directly neutralized in the transfer chamber described in the Patent Document 1. For example, the semiconductor wafer is electrically charged by the processing such as plasma etching or the like, so that the particles are easily attracted to the charged semiconductor wafer by the electrostatic force when the charged semiconductor wafer returns to the transfer chamber in the depressurized environment. Further, the semiconductor wafer may be electrically charged when the semiconductor wafer in the atmospheric environment is loaded into the transfer chamber in the atmospheric environment.

The adhesion of particles to the semiconductor wafer by the electrostatic force is facilitated as a particle diameter of the particles decreases. Accordingly, in order to cope with a trend towards a fine pattern of other semiconductor devices, the adhesion of fine particles to the semiconductor wafer which is not a problem in manufacturing semiconductor devices in a prior art needs to be prevented by neutralizing the charge of the semiconductor wafer and preferably by neutralizing the charge of the particles on the semiconductor wafer.

Overall, in the technique described in the Patent Document 1, the charge of the semiconductor wafer can be neutralized by the ions generated by the charge neutralizer. However, when the ion generation method using a corona discharge is used, the particles generated by the corona discharge may be adhered to the semiconductor wafer, or it may be difficult to control the corona discharge at a low pressure. Further, in the ion generation method using UV irradiation or X-ray irradiation, the semiconductor wafer may be damaged by the UV irradiation or the like to the semiconductor wafer.

SUMMARY OF THE INVENTION

In view of the above, the present invention provides a method and a transfer chamber for preventing adhesion of particles to a target substrate to be processed by neutralizing the charge of the target substrate without damaging the target substrate.

In accordance with an aspect of the present invention, there is provided a transfer chamber provided between a processing unit for performing a predetermined process on a target substrate to be processed in a depressurized environment and an atmospheric maintaining unit for maintaining the target substrate in an atmospheric environment, for transferring the target substrate between the processing unit and the atmospheric maintaining unit, the transfer chamber including: a chamber main body for accommodating the target substrate; a gas exhaust unit for exhausting inside of the chamber main body to set the inside of the chamber main body to the depressurized environment; a gas supply unit for supplying a predetermined gas to the chamber main body to set the inside of the chamber main body to the atmospheric environment; an ionization unit provided outside the chamber main body, for ionizing the predetermined gas; and an ionized gas supply unit for supplying the ionized gas generated by the ionization unit to the chamber main body.

In accordance with another aspect of the present invention, there is provided a particle adhesion preventing method used in the case of transferring a target substrate to be processed between a processing unit for performing a predetermined process on the target substrate in a depressurized environment and an atmospheric maintaining unit for maintaining the target substrate in an atmospheric environment by using a transfer chamber provided therebetween, the transfer chamber including a chamber main body which is switchable between the depressurized environment and the atmospheric environment, the particle adhesion preventing method including: accommodating the target substrate in the chamber main body; and neutralizing a charge of the target substrate by supplying an ionized gas generated outside the chamber main body into the chamber main body.

In accordance with the transfer chamber and the particle adhesion preventing method of the present invention, the target substrate and the particles in the chamber main body can be charge-neutralized by the ionized gas, so that the adhesion of the particles to the target substrate by the electrostatic force can be prevented.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

The embodiments of the present invention will be described with reference to the accompanying drawings which form a part hereof.

Figure 1:
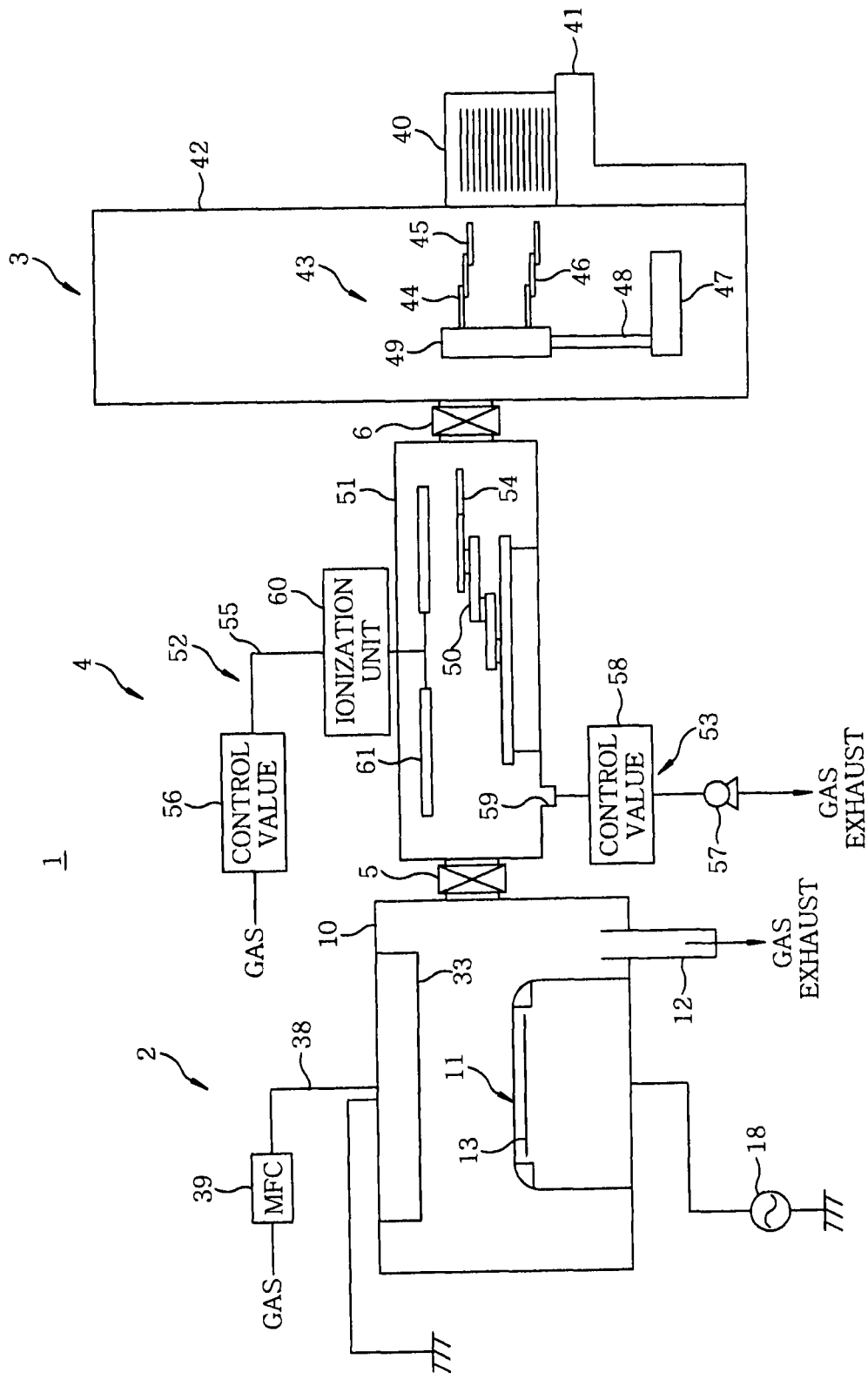
FIG. 1 is a vertical cross sectional view showing a schematic configuration of a substrate processing system including a transfer chamber in accordance with an embodiment of the present invention.

FIG. 1 is a vertical cross sectional view showing a schematic configuration of a substrate processing system including a transfer chamber in accordance with an embodiment of the present invention.

A substrate processing system 1 is configured as a so-called single wafer etching apparatus for performing plasma etching on semiconductor wafers W as substrates to be processed one by one.

As shown in FIG. 1, the substrate processing system 1 includes a substrate processing unit 2 for etching a wafer W; an atmospheric transfer unit 3 for loading and unloading the wafer W into and from a FOUP 40 serving as a container for accommodating a predetermined number of wafers W; and a transfer chamber 4 provided between the substrate processing unit 2 and the atmospheric transfer unit 3, for transferring the wafer W therebetween.

The atmospheric transfer unit 3 has a predetermined number of mounting tables 41, each of which mounts thereon a FOUP 40; and a loader module 42 for loading and unloading wafers W into and from the FOUP 40 mounted on each mounting table 41.

The FOUP 40 is mounted on the mounting table 41 with its opening/closing door (not shown) facing the loader module 42. Provided on a sidewall facing the FOUP 40 in the loader module 42 is a window portion (not shown) which is opened and closed by a shutter (not shown) that can be engaged with the opening/closing door of the FOUP 40. The inside of the FOUP 40 and that of the loader module 40 communicate with each other by opening the window portion by moving the opening/closing door of the FOUP 40 and the shutter together.

The FOUP 40 is designed to hold typically 25 wafers horizontally arranged in a vertical direction at regular intervals. The loader module 42 is a rectangular parallelepiped box, and has therein a SCARA-type transfer unit 43 which can access to the inside of the FOUP 40 and transfer the wafers W.

The transfer unit 43 has a multi-joint mapping arm 46, which is configured to be extensible and contractible, to perform mapping operation for detecting an accommodation state of the wafers W in the FOUP 40 (position of normally accommodated wafers W, abnormality such as edge displacement or protrusion of the wafers W or the like) and the number of the wafers W. A leading end of the mapping arm 46 is provided with a mapping sensor, e.g., a non-contacting type sensor (not shown) using a semiconductor laser or the like.

A base end of the mapping arm 46 is connected to an elevation unit 49 moving vertically along a support column 48 standing up from a base portion 47 of the transfer unit 43. The mapping arm 46 is raised or lowered by driving the elevation unit 49 in a state where the non-contacting type sensor is positioned at a predetermined distance from the FOUP 40, thereby performing the mapping operation.

The transfer unit 43 is provided with a transfer arm 44 which has a base end connected to the elevation unit 49 and a multi-joint structure configured to be extensible and contractible. The transfer arm 44 has a pick 45 attached to a leading end thereof, for holding the wafer W, and accesses to a predetermined height in the FOUP 40 according to the mapping result to load and unload the wafer W into and from the FOUP 40.

The support column 48 is configured to be rotatable, so that the pick 45 of the transfer arm 44 can access to the transfer chamber 4 as well as the FOUP 40 shown in FIG. 1. Accordingly, the wafer W can be transferred between the atmospheric transfer unit 3 and the transfer chamber 4.

The configuration of the transfer chamber 4 will be described in detail later. Hereinafter, the substrate processing unit 2 will be briefly described.

The substrate processing unit 2 includes a processing chamber 10 forming a processing space for etching the wafer W. Provided in the processing chamber 10 is a susceptor 11 serving as a stage for mounting thereon the wafer W and an electrode for generating a plasma. Further, a shower head 33 for injecting a processing gas toward the wafer W mounted on the susceptor 11 is disposed near the inner ceiling of the processing chamber 10.

A gas exhaust port 12 is formed on a bottom wall of the processing chamber 10. The processing chamber 10 can be maintained in a depressurized environment by using a depressurization unit such as a vacuum pump (not shown) or the like installed at the gas exhaust port 12.

A high frequency power supply 18 is connected to the susceptor 11 via a matching unit (not shown), and applies a predetermined high frequency power to the susceptor 11. That is, the susceptor 11 serves as a lower electrode.

Moreover, an electrode plate 13 for electrostatically attracting the wafer W is buried in the susceptor 11, the electrode plate 13 being made of a conductive film. A DC power supply (not shown) is electrically connected to the electrode plate 13. The wafer W is attracted and held on a top surface of the susceptor 11 by Coulomb force or Johnson-Rahbeck force generated by applying a DC voltage to the electrode plate 13.

Although the susceptor 11 has a focus ring, a cooling mechanism, a mechanism for supplying gas to a backside of the wafer W, a wafer elevation mechanism for loading and unloading the wafer W into and from the susceptor 11 and the like, the description thereof will be omitted.

The shower head 33 is grounded (earthed), and forms a pair of electrodes together with the susceptor 11. The shower head 33 serves as a ground electrode. A processing gas or a gas such as $N_2$ gas or the like is supplied to the shower head 33 through a gas supply line 38, and then is injected toward the wafer W mounted on the susceptor 11 through a plurality of gas ventholes (not shown) formed on a bottom surface of the shower head 33. The amount of gas injected from the shower head 33 is controlled by an MFC (Mass Flow Controller) 39 provided at the gas supply line 38.

A plasma of the processing gas is generated between the susceptor 11 and the shower head 33 by injecting the processing gas at a predetermined flow rate from the shower head 33 toward the wafer W and applying a predetermined voltage to the susceptor 11 while maintaining the processing chamber 10 in a predetermined depressurized environment. The ions in the plasma are attracted to the wafer W by an electric field generated between the susceptor 11 and the shower head 33, thereby performing etching process on the wafer W.

Hereinafter, a configuration of the transfer chamber 4 will be described in detail.

The transfer chamber 4 includes a chamber main body 51 whose environment can be switched between an atmospheric state and a depressurized state; and various devices provided at the chamber main body 51.

A gate valve 5 and a gate valve 6 are provided between the chamber main body 51 and the processing chamber 10 and between the chamber main body 51 and the loader module 42, respectively. The gate valve 6 is opened when the chamber main body 51 is in the atmospheric environment. At that time, the wafer W can be transferred between the atmospheric transfer unit 3 and the transfer chamber 4 (between the loader module 42 and the chamber main body 51). On the other hand, when the gate valve 6 is closed, the chamber main body 51 can be switched its environment to the depressurized environment while maintaining the loader module 42 in the atmospheric environment.

Since the processing chamber 10 is constantly maintained in the depressurized environment, the gate valve 5 is opened in a state where the chamber main body 51 is in the depressurized environment. At that time, the wafer W can be transferred between the substrate processing unit 2 and the transfer chamber 4 (between the processing chamber and the chamber main body 51). The gate valve 5 is maintained in a closed state except when the wafer W is transferred between the substrate processing unit 2 and the transfer chamber 4.

The chamber main body 51 has therein a transport arm (transfer unit) configured to be extensible, contractible and rotatable. A SCARA-type transfer arm having a plurality of arm portions can be used for the transport arm 50. A pick 54 attached to the leading end of the transport arm 50 mounts and holds the wafer W. The pick 54 moves into the loader module 42 when the gate valve 6 is opened, and the wafer W is transferred between the pick 45 and the pick 54. Further, the pick 54 moves into the processing chamber 10 when the gate valve 5 is opened, and the wafer W is transferred between the susceptor 11 and the pick 54. Moreover, the transport arm 50 may be of a frog leg type or a double arm type.

A gas exhaust port 59 is provided on a bottom wall of the chamber main body 51, and a gas exhaust unit 53 for depressurizing the chamber main body 51 is installed at the gas exhaust port 59. The gas exhaust unit 53 includes a vacuum pump 57 and a control valve 58 provided in a gas exhaust line installed at the gas exhaust port 59. The gas exhaust amount of the gas exhaust unit 53 can be continuously and freely changed by controlling an opening degree of the control valve 58 within a maximum exhausting capacity of the vacuum pump 57. Although a single gas exhaust port 59 is illustrated in FIG. 1, a plurality of gas exhaust ports 59 are provided at a plurality of locations.

The chamber main body 51 has an air supply system 52 serving as a gas supply unit for supplying to the chamber main body 51 a gas (purge gas) for setting the inside of the chamber main body 51 to the atmospheric environment and also serving as an ionized gas supply unit for generating an ionized gas by ionizing the purge gas and supplying the ionized gas to the chamber main body 51 as will be described later.

The air supply system 52 has a gas supply line 55 for supplying at least one gas selected from dry air, $N_2$ gas, Ar gas, $O_2$ gas and the like to the chamber main body 51 while controlling the flow rate thereof by the control valve 56; an ionization unit 60 provided outside the chamber main body 51, for generating an ionized gas by ionizing the gas supplied through the gas supply line 55; and a brake filter for discharging the ionized gas supplied from the ionization unit 60 through the gas supply line 55 inside the chamber main body 51.

The pressure in the chamber main body 51 (e.g., pressure decreasing rate, pressure increasing rate and pressure maintenance) can be freely adjusted by properly controlling the control valve 56 for controlling the gas amount supplied to the chamber main body 51 and the control valve 58 for controlling the gas amount exhausted from the chamber main body 51.

The ionization unit 60 generates an ionized gas by ionizing the gas supplied through the gas supply line 55 by using various methods such as corona discharge, UV irradiation, X-ray irradiation and the like. The ionized gas denotes a gas in which a part of the molecules thereof is ionized. The ionization unit 60 may have devices for performing a plurality of ionization methods, or may be configured to select an ionization method depending on gas types. The ionization unit 60 is preferably disposed near the outside of the chamber main body 51 so that the generated ions can be effectively supplied onto the wafer W.

The brake filter 61 is a net-shaped metal filter having a length of, e.g., about 200 mm and is capable of having a large gas discharge area so that a flow velocity of a gas discharged therethrough can be reduced. Accordingly, the gas can be uniformly discharged over a large area, and the particles can be prevented from swirling up in the chamber main body 51. Moreover, by using the brake filter 61, the pressure in the chamber main body 51 can be uniformly increased as needed.

As illustrated in FIG. 1, the brake filter 61 is provided (near the inner ceiling of the chamber main body 51) above the wafer W, and the gas exhaust port 59 is provided on the bottom wall of the chamber main body 51. Accordingly, when the gas is discharged from the brake filter 61 and is exhausted from the gas exhaust port 59, the ionized gas can flow in such a manner that the ionized gas is discharged from the brake filter 61 toward the gas exhaust port 59 after contacting the wafer W, as will be described later. As a consequence, the ionized gas can be effectively supplied to the wafer W, and the charge of the wafer W can be neutralized easily.

Further, the discharge of the gas in the chamber main body 51 is not necessarily performed by using the brake filter 61, and may also be performed by using one having a structure for discharging a gas toward the top surface of the wafer W, such as the shower head 33 of the substrate processing unit 2. The member such as the brake filter 61 for discharging the ionized gas in the chamber main body 51 or the like is preferably made of a material which prevents conversion of ions in the ionized gas to neutral molecules, and has a structure which ensures a long lifetime of ions.

The substrate processing system 1 configured as described above is computer-controlled by a control unit (not shown). By executing programs (software) for processing the wafer W based on predetermined recipes, various driving units of the substrate processing system 1 operate, thereby processing the wafer W.

The following is a description of the method for preventing particles from being adhered to the wafer W by neutralizing the charge of the wafer W in the course of transferring the wafer W in the transfer chamber 4.

First, the method for preventing particles from being adhered to the wafer W in the course of transferring the wafer W from the atmospheric transfer unit 3 to the substrate processing unit 2 will be explained.

Figure 2:
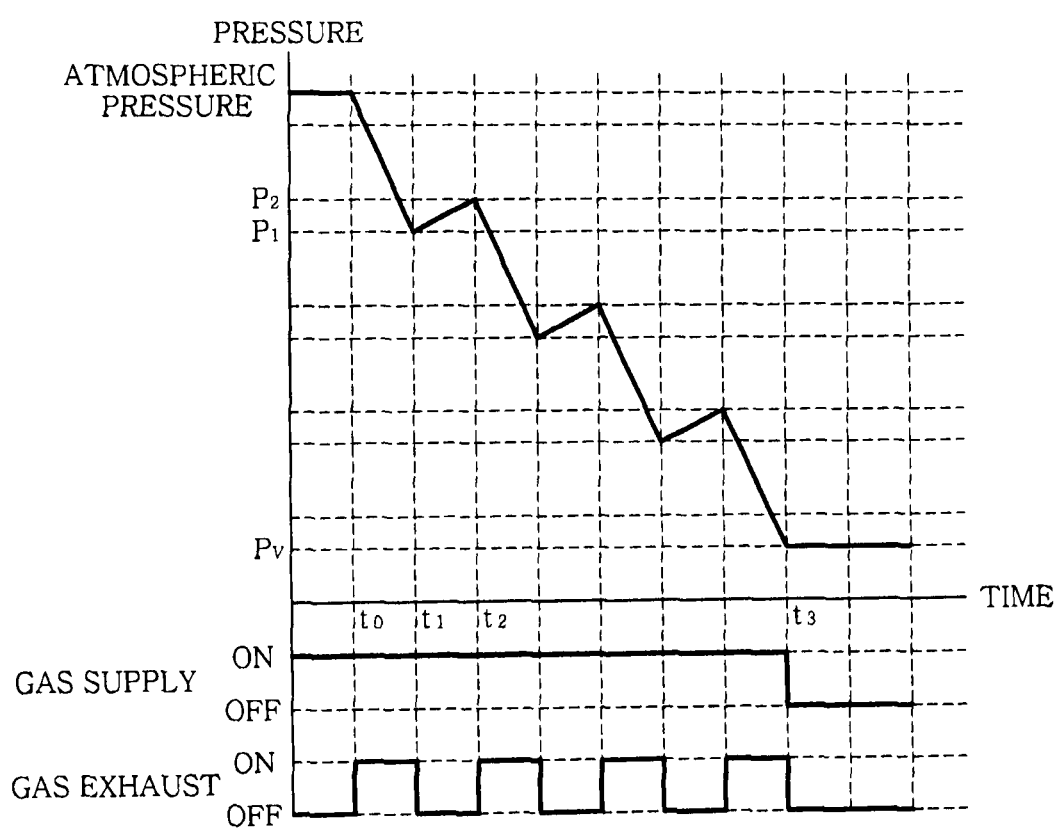
FIG. 2 schematically illustrates a first pressure control pattern of the transfer chamber.

FIG. 2 schematically shows a first pressure control pattern of the transfer chamber. FIG. 2 illustrates pressure change in the chamber main body 51 and ON/OFF timings of the control valve 56 in the air supply system 52 and the control valve 58 in the gas exhaust unit 53.

The gas flow rate can be continuously and freely changed by the control valve 56. In the present embodiment, however, the control valve 56 is switched between "ON state" in which a gas flows at a regular flow rate and "OFF state" in which no gas flows. In the same manner, the gas is exhausted when the control valve 58 is in "On state", and the gas is not exhausted when the control valve 58 is in "OFF state". Further, as will be described in pressure control patterns to be described later (FIGS. 2 to 5), the ionization unit 60 does not operate when the control valve 56 is in OFF state, and operates to generate an ionized gas when the control valve 56 is in ON state.

First, a purge gas, e.g., $N_2$ gas, is supplied by the air supply system 52 into the chamber main body 51, so that the chamber main body 51 is maintained in the atmospheric environment. In that state, the gate valve 6 is opened, and the wafer W is transported from the pick 45 to the pick 54. Next, the gate valve 6 is closed. Although the vacuum pump of the gas exhaust unit 53 operates until time $t_0$ at which the gate valve 6 is closed, the control valve 58 is in OFF state and, thus, the chamber main body 51 is not depressurized.

The ionization unit 60 is in ON state until the time $t_0$. In that case, by setting the inner pressure of the chamber main body 51 to a pressure slightly positive with respect to the inner pressure of the loader module 42, it is possible to prevent the movement of the particles from the loader module 42 to the chamber main body 51 which is caused by inflow of air. Further, the ionized gas is introduced from the chamber main body 51 into the loader module 42 through the gate valve 6 and then into the FOUP 40, so that there can be an effect on neutralizing the charge of the wafer W held by the pick 45 and/or the charge of the wafer W in the FOUP 40. However, such effect can be obtained only during the lifetime of the ions in the ionized gas (until the ions are converted to neutral molecules).

The wafer W held by the pick 54 may be electrically charged. In order to neutralize the charge of the wafer W in the chamber main body 51 and prevent the adhesion of the particles by the electrostatic force to the wafer W, the following processes are carried out.

When the gate valve 6 is closed, the transport arm 50 quickly starts to transfer the wafer W from the side of the atmospheric transfer unit 3 (the loader module 42) to the side of the substrate processing unit 2 (the processing chamber 10) in the chamber main body 51. The transfer speed of the wafer W is set in accordance with time $t_3$ required to decrease the pressure in the chamber main body 51 to a target pressure Pv at which the gate valve 5 can be opened. The wafer W may be continuously transferred at a regular speed, or may be temporarily stopped at a central portion or the like in the chamber main body 51.

When the gate valve 6 is closed, the control valve 58 is quickly switched to ON state. Accordingly, the gas is exhausted, and the chamber main body 51 is depressurized. The control valve 56 is maintained in ON state, so that the ionized gas is supplied to the chamber main body 51. Herein, the gas exhaust amount of the gas exhaust unit 53 is larger than the air supply amount of the air supply system 52.

During the depressurization of the chamber main body 51, the ionized gas tends to flow from the ceiling portion where the brake filter 61 is provided toward the bottom wall where the gas exhaust port 59 is provided inside the chamber main body 51. Accordingly, the ionized gas can effectively contact with the wafer W, and the charge of the wafer W is neutralized by coupling the surface charges on the wafer W and charges of the ions. As a consequence, the adhesion of the particles to the wafer W by the electrostatic force can be prevented.

Further, the electrically charged particles in the chamber main body 51 are charge-neutralized by the ions contained in the ionized gas. The charge-neutralized particles are easily exhausted without being adhered to the wafer W or the internal members of the chamber main body 51. Hence, the adhesion of the particles to the wafer W can be prevented.

Next, the control valve 58 is switched to OFF state at time $t_1$ when the pressure in the chamber main body 51 reaches a preset pressure $P_1$. Meanwhile, the control valve is maintained in ON state, so that the supply of the ionized gas to the chamber main body 51 is continued. Accordingly, the pressure of the chamber main body 51 begins to increase.

At that time, the ionized gas is uniformly diffused in the chamber main body 51, so that particles floating in the chamber main body 51 or adhered to the inner wall of the chamber main body 51 by the electrostatic force can be charge-neutralized. The charge-neutralized particles can be easily exhausted through the gas exhaust port 59 when the chamber main body 51 is depressurized again. Further, the wafer W or the internal members of the chamber main body 51 can be charge-neutralized by the ionized gas, so that the adhesion of the particles thereto can be prevented.

At time $t_2$ when the pressure in the chamber main body reaches a preset pressure $P_2$, the control valve 58 is switched to ON state again, and the chamber main body 51 is depressurized again. If the pressure $P_2$ is set to a low level, the deterioration of the throughput is suppressed. On the contrary, if the pressure $P_2$ is set to a high level, the supply amount of the ionized gas to the chamber main body 51 increases, thereby increasing the above-described charge-neutralization effect on the particles and the like. Thus, the pressure $P_2$ is set to a proper level while considering the electrically charged state of the wafer W.

After the time $t_2$, the wafer W is charge-neutralized by decreasing and increasing the pressure of the chamber main body 51 alternately as shown in FIG. 2. At the time $t_3$ when the pressure reaches the ultimate target pressure Pv, the control valves 56 and 58 and the ionization unit 60 are switched to OFF state, and the pressure of the chamber main body 51 is maintained. At the time $t_3$, it is preferable that the transfer of the wafer W, the transport near the gate valve 5, is completed so that the wafer W held by the pick 54 can be quickly loaded into the processing chamber 10 by the transport arm 50 when the gate valve 5 is opened. Accordingly, the throughput of the transfer process in the transfer chamber 4 can be increased.

After the time $t_3$, the gate valve 5 is quickly opened, and the transport arm 50 accesses to the inside of the processing chamber 10. Next, the wafer W held by the pick 54 is transferred to be mounted on the susceptor 11, and the gate valve 5 is closed. Thereafter, the etching process of the wafer W in the processing chamber 10 is started.

Figure 3:
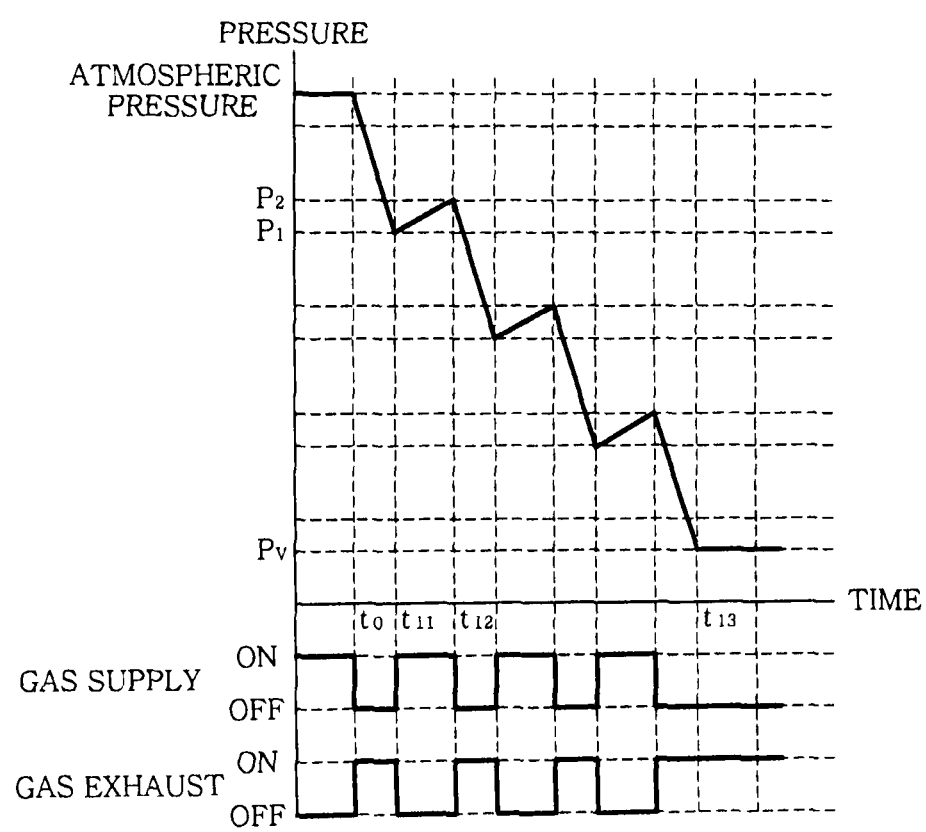
FIG. 3 depicts a second pressure control pattern of the transfer chamber.

Hereinafter, the second pressure control pattern of the transfer chamber 4 will be described with reference to FIG. 3. The second pressure control pattern is used to transfer the wafer W from the atmospheric transfer unit 3 to the substrate processing unit 2. FIG. 3 depicts pressure change in the chamber main body 51 and ON/OFF timings of the control valve 56 in the air supply system 52 and the control valve 58 in the gas exhaust unit 53.

As clearly can be seen from the comparison between FIG. 2 and FIG. 3, the first pressure control pattern shown in FIG. 2 is different from the second pressure control pattern shown in FIG. 3 in the ON/OFF timing of the control valve 56 of the air supply system 52. That is, in the first pressure control pattern, the ionized gas is constantly supplied to the chamber main body 51. However, in the second pressure control pattern, the supply of the ionized gas to the chamber main body 51 is stopped when the chamber main body 51 is depressurized.

Accordingly, the depressurization rate in the second pressure control pattern is higher than that in the first pressure control pattern. As can be clearly seen from FIGS. 2 and 3, the pressure at which the depressurization is temporarily stopped (e.g., pressure $P_1$) and the pressure at which the pressure increase is stopped (e.g., pressure $P_2$) in the second pressure control pattern are the same as those in the first pressure control pattern. Therefore, time $t_{13}$ required for the pressure in the chamber main body 51 to reach the target pressure Pv in the second pressure control pattern is shorter than the time $t_3$ in the first pressure control pattern, which leads to increase the throughput.

In the second pressure control pattern as well, the pressure increasing period (e.g., between time $t_{11}$ and time $t_{12}$) is provided in the course of decreasing the pressure from the atmospheric pressure to the target pressure Pv. Therefore, by diffusing the ionized gas in the chamber main body 51 in this period, the wafer W can be charge-neutralized. Besides, in the second pressure control pattern, a specific period of time can be reduced by increasing the depressurization rate. Accordingly, such a reduced period of time can compensate for the period of time that it takes to increase the supply amount of the ionized gas.

The following is description of a method for preventing adhesion of particles to the wafer W during the transfer of the wafer W from the substrate processing unit 2 to the atmospheric transfer unit 3.

Figure 4:
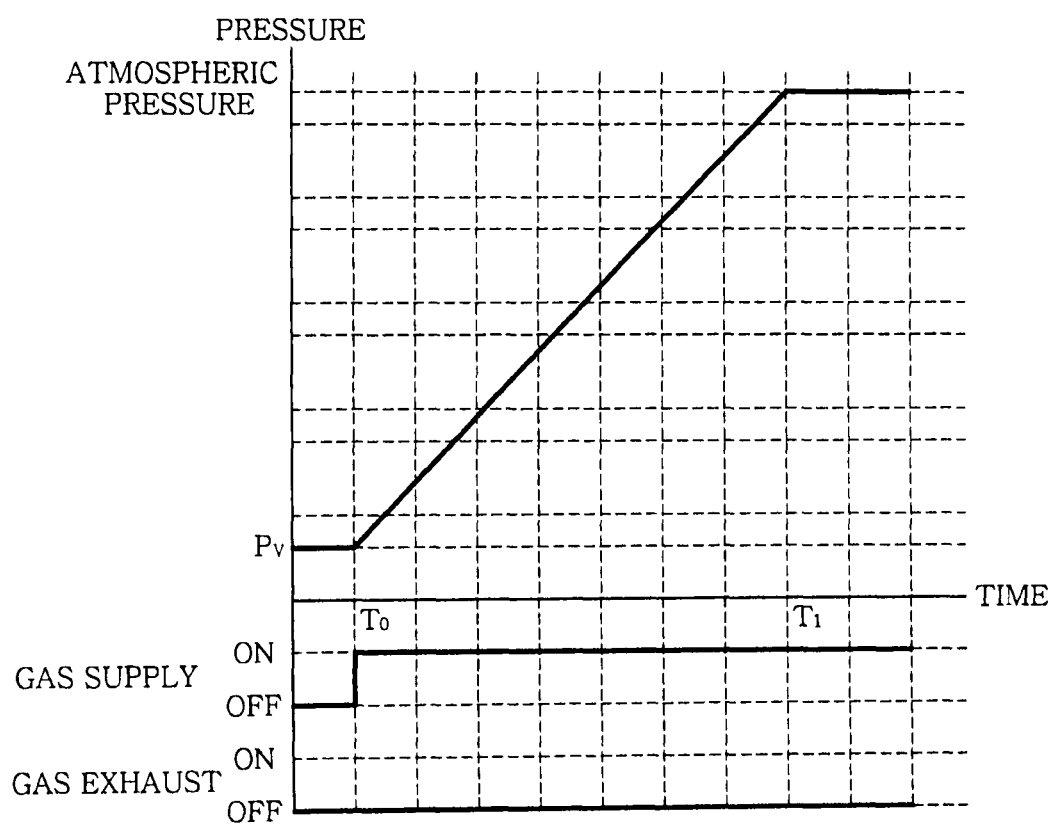
FIG. 4 describes a third pressure control pattern of the transfer chamber.

FIG. 4 schematically illustrates a third pressure control pattern of the transfer chamber. FIG. 4 shows pressure change of the chamber main body 51 and ON/OFF timings of the control valve 56 in the air supply system 52 and the control valve 58 in the gas exhaust unit 53.

First, the chamber main body 51 is maintained in the depressurized environment having the pressure Pv at which the gate valve 5 can be opened. When the gate valve 5 is opened, the transport arm 50 accesses to the susceptor 11 and receives the wafer W from the susceptor 11. After the wafer W is loaded into the chamber main body 51, the gate valve 5 is closed.

The control valves 56 and 58 are switched to OFF state until the time $T_0$ at which the gate valve 5 is closed. However, the control valve 58 may be intermittently switched to ON state so that the chamber main body 51 can be maintained in the depressurized state.

The wafer W held by the pick 54 of the transport arm 50 may be electrically charged by the etching process in the substrate processing unit 2. In order to neutralize the charge of the wafer W in the chamber main body 51 and prevent particles from being adhered to the wafer W by the electrostatic force, the following processes are carried out.

When the gate valve 5 is closed, the transport arm 50 quickly starts to transfer the wafer W from the side of the substrate processing unit 2 to the side of the atmospheric transfer unit 3 in the chamber main body 51. Here, a way of transferring the wafer W can be the same as the above-described way of transferring the wafer W from the side of the atmospheric transfer unit 3 to the side of the substrate processing unit 2 in the chamber main body 51.

At the time $T_0$, the control valve 56 (and the ionization unit 60) is switched to ON state, and the supply of the ionized gas to the chamber main body 51 is started. The control valve 58 is maintained in OFF state even after the time $T_0$, so that the pressure of the chamber main body is increased. The wafer W is charge-neutralized by coupling the surface charges on the wafer W and charges of the ions in the ionized gas diffused in the chamber main body 51, so that the adhesion of the particles to the wafer W by the electrostatic force is prevented.

At the time $T_1$ when the chamber main body 51 is switched to the atmospheric environment, it is preferable that the transfer of the wafer W to a position near the gate valve 6 is completed so that the wafer W held by the pick 54 can be quickly loaded into the loader module 42 by the transport arm 50 when the gate valve 6 is opened. Accordingly, the throughput of the transfer process in the transfer chamber 4 can be increased.

After the time $T_1$, the gate valve 6 is opened quickly, and the transport arm 50 accesses to the inside of the loader module 42. Next, the wafer W held by the pick 54 is transferred to the pick 45 of the transfer arm 44, and then is accommodated in a predetermined position in the FOUP 40.

Figure 5:
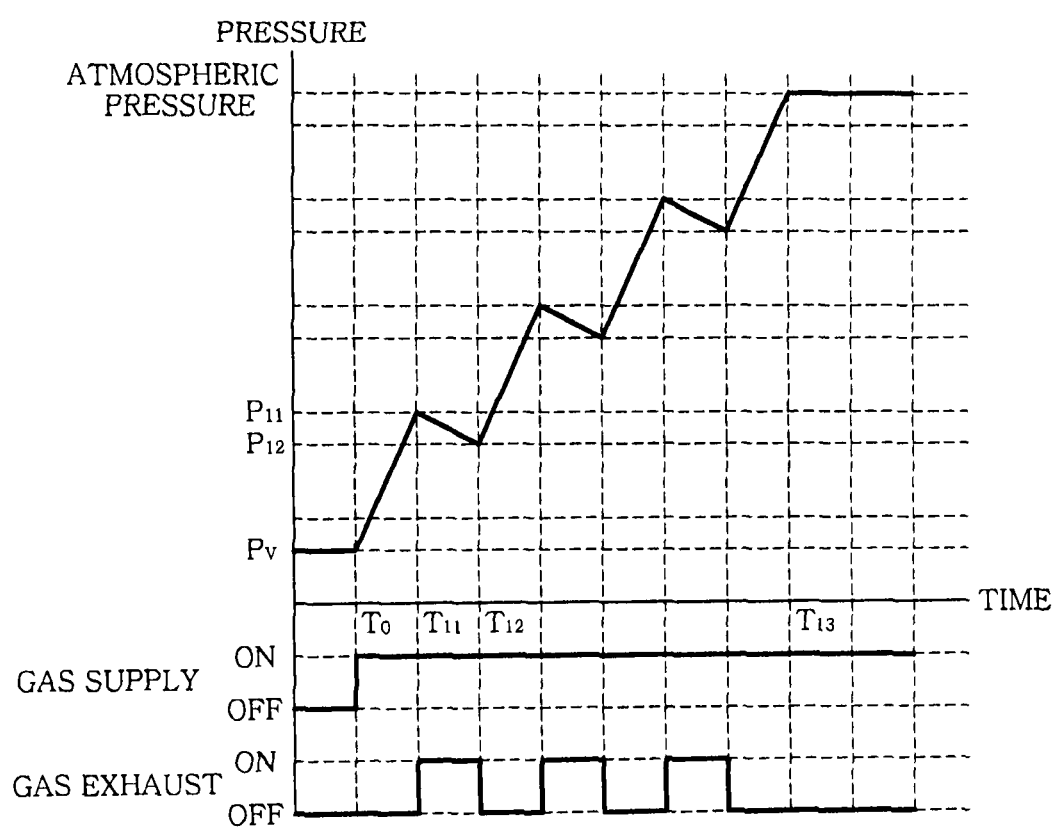
FIG. 5 shows a fourth pressure control pattern of the transfer chamber.

Hereinafter, a fourth pressure control pattern of the transfer chamber 4 will be described with reference to FIG. 5. The fourth pressure control pattern is used to transfer the wafer W from the substrate processing unit 2 to the atmospheric transfer unit 3. FIG. 5 shows pressure change of the chamber main body 51 and ON/OFF timings of the control valve 56 in the air supply system 52 and the control valve 58 in the gas exhaust unit 53.

After the wafer W is unloaded from the processing chamber 10 by the transport arm 50, the gate valve 5 is closed, and the transfer of the wafer W in the chamber main body 51 by the transport arm 50 is started. At the time $T_0$ when the gate valve 5 is closed, the control valve 56 (and the ionization unit 60) is switched to ON state, and the supply of the ionized gas to the chamber main body 51 is started. In this manner, the wafer W is charge-neutralized by the ionized gas diffused in the chamber main body 51.

As shown in FIG. 5, at the time $T_{11}$ when the chamber main body 51 reaches a predetermined pressure $P_{11}$, the control valve 58 is switched to ON state (the vacuum pump 57 is constantly driven), and the pressure in the chamber main body 51 is changed from the increasing state to the decreasing state. Accordingly, the ionized gas flows from the ceiling portion toward the bottom portion inside the chamber main body 51, and the ions in the ionized gas can easily contact with the wafer W. That is, the charge neutralization of the wafer W can be effectively performed.

Next, at the time $T_{12}$ at which the pressure of the chamber main body 51 decreases to a predetermined pressure $P_{12}$, the control valve 58 is switched to OFF state, and the pressure of the chamber main body 51 is increased again. If the pressure $P_{12}$ is set to a high level (however, $P_{11} > P_{12}$), the throughput is increased. On the other hand, if the pressure $P_{12}$ is set to a low level, the charge-neutralization effect of the ionized gas is increased. Therefore, the pressure $P_{12}$ is set to a proper level while considering the electrically charged state of the wafer W.

After the time $T_{12}$, the pressure in the chamber main body 51 is increased and decreased alternately as shown in FIG. 5, and is finally set to the atmospheric pressure. After the time $T_{13}$ when the pressure reaches the atmospheric pressure, the control valve 58 is maintained in OFF state, and the control valve 56 and the ionization unit 60 are maintained in ON state.

After the time $T_{13}$, the gate valve 6 is opened, and the wafer W held by the pick 54 of the transport arm 50 is loaded into the loader module 42. Next, the wafer W is transferred to the pick 45 of the transfer arm 44, and then is accommodated in a predetermined position in the FOUP 40.

As described above, in accordance with the present invention, the wafer W and the particles in the chamber main body 51 can be charge-neutralized by the ionized gas, so that the adhesion of the particles to the wafer W by the electrostatic force can be prevented. The configuration of the apparatus can be simplified by using the air supply system 52 serving as a unit for generating an ionized gas by ionizing a purge gas supplied to the chamber main body 51. Further, the air supply system 52 can be easily constructed by installing an ionization unit at the purge gas supply unit of the conventional substrate processing system. Moreover, the cleanness of the chamber main body 51 can be increased by exhausting from the chamber main body 51 the particles, the charge of which is neutralized by varying the pressure in the chamber main body 51 and, further, the adhesion of the particles to the wafer W by the electrostatic force can be effectively prevented.

Further, in accordance with the present invention, the wafer W is charge-neutralized after being processed in the substrate processing unit 2 and, thus, it is possible to suppress the adhesion of the particles by the electrostatic force to the wafer W that has been transferred to a next process while being accommodated in the FOUP 4. Further, the wafer W is charge-neutralized after being loaded into the substrate processing unit 2 and, thus, it is possible to prevent the adhesion of the particles by the electrostatic force to the wafer W. Accordingly, the processing is hardly affected by the particles in the processing chamber.

If the pressure is temporarily increased in the course of changing an environment in the chamber main body 51 from the atmospheric environment to the depressurized environment, the ionized gas is diffused in the entire chamber main body 51. Accordingly, the particles in the chamber main body 51 can be charge-neutralized. The charge-neutralized particles can be exhausted from the chamber main body 51 when the chamber main body 51 is depressurized again, so that the cleanness of the chamber main body 51 can be increased. Such effects can also be obtained by temporarily decreasing a pressure in the course of changing the environment in the chamber main body 51 from the depressurized environment to the atmospheric environment.

Although the embodiments of the present invention have been described, the present invention is not limited thereto. For example, although the substrate processing system 1 is constructed by applying a function of a charge neutralization system to the air supply system 52 for supplying a purge gas to the chamber main body 51, it is also possible to employ a configuration in which the purge gas supply system and the ionized gas supply system are completely separated.

In the above description, a pattern for alternately decreasing and increasing a pressure is used as a pressure control pattern for changing the environment in the chamber main body 51 from the atmospheric environment to the depressurized environment. However, even in the case of using a pattern for continuously decreasing a pressure while supplying an ionized gas to the chamber main body 51 without increasing a pressure, the wafer W can be properly charge-neutralized. Accordingly, the adhesion of the particles to the wafer W by the electrostatic force can be prevented, and the throughput can be increased.

Although a pattern for increasing and decreasing a pressure alternately while constantly supplying an ionized gas is used as a pressure control pattern for changing the environment in the chamber main body 51 from the depressurized environment to the atmospheric environment, the supply of the ionized gas to the chamber main body 51 may be stopped when the pressure is decreased.

In the above description, the substrate processing unit 2 performs an etching process on the wafer W. However, the substrate processing unit may perform a film forming process or a diffusion process on the wafer W. Moreover, although a semiconductor wafer is used as a target substrate to be processed (object to be charge neutralized) in the above description, the target substrate is not limited thereto, and may be various substrates such as a substrate for use in an LCD (Liquid Crystal Display), an FPD (Flat Panel Display) or the like, a photomask, a CD substrate, a printed circuit board or the like.

Further, it is to be understood that the object of the present invention can also be attained by supplying to a computer (e.g., a control unit) a storage medium in which a program code of software that realizes the functions of the aforementioned embodiments is stored, and then causing a CPU of the computer to read out and execute the program code stored in the storage medium.

In this case, the program code itself read out from the storage medium realizes the functions of the aforementioned embodiments and, hence, the program code and the storage medium in which the program code is stored are also part of the present invention.

Moreover, the storage medium for supplying the program code may be, e.g., an RAM, an NV-RAM, a floppy (registered trademark) disk, a hard disk, a magnetic-optical disk, an optical disk such as a CD-ROM, a CD-R, a CD-RW, a DVD (a DVD-ROM, a DVD-RAM, a DVD-RW, a DVD+RW) or the like, a magnetic tape, a non-volatile memory card, another ROM or the like. Alternatively, the program code may be supplied to the computer by downloading from another computer (not shown), a database (not shown) or the like connected to the Internet, a commercial network, an LAN (local area network) or the like.

Besides, it is to be understood that the functions of the aforementioned embodiments may be accomplished not only by executing the program code read out by the computer, but also by causing an OS (operating system) or the like that operates on the CPU to perform a part or all of the actual operations based on instructions of the program code.

Further, it is to be understood that the functions of the aforementioned embodiments may also be accomplished by writing the program code read out from the storage medium into a memory provided on a function expansion board inserted into the computer or in a function expansion unit connected to the computer, and then causing the CPU or the like provided on the expansion board or in the expansion unit to perform a part or all of the actual operations based on instructions of the program code.

The program codes may take the form of an object code, a program code executed by an interpreter, script data supplied to an OS, or the like.

While the invention has been shown and described with respect to the embodiments, it will be understood by those skilled in the art that various changes and modification may be made without departing from the scope of the invention as defined in the following claims.

What is claimed is:

1. A method for preventing particle adhesion to a target substrate in a chamber, the chamber comprising a chamber main body which is switchable between a depressurized environment and an atmospheric pressure environment, an ionization unit configured to generate an ionized gas to be supplied into the chamber main body, and a gas exhaust unit configured to exhaust the chamber main body, the method comprising:
    accommodating the target substrate into the chamber main body;
    performing a first step in which an inner pressure of the chamber main body is increased to a first pressure less than a pressure of the atmospheric pressure environment by supplying the ionized gas into the chamber main body without exhausting the chamber main body;
    performing a second step in which the inner pressure is decreased to a second pressure by exhausting the chamber main body while supplying the ionized gas thereinto; and
    performing a third step in which the inner pressure is increased to a third pressure by supplying the ionized gas into the chamber main body while stopping exhausting the chamber main body,
    wherein the second and third steps are both sequentially repeated a plurality of times until an environment of the chamber main body reaches the pressure of the atmospheric pressure environment,
    wherein the third pressure is higher than the first pressure and lower than a pressure of the atmospheric pressure environment, and the second pressure is lower than the first pressure, and
    wherein, for each sequential repetition of the second and third steps, the second and the third pressures of a subsequent repetition are higher than the second and third pressures, respectively, of a prior repetition of the second and third steps.

2. The method of claim 1, wherein the chamber further includes a brake filter through which the ionized gas is supplied.

3. The method of claim 1, wherein after performing said accommodating step and before performing the first step, the inner pressure is maintained at a predetermined pressure while starting supply of the ionized gas into the chamber main body.

4. The method of claim 3, wherein the chamber further includes a brake filter through which the ionized gas is supplied.

* * * * *